United States Patent [19]

Ishikawa

[11] Patent Number: 5,337,283
[45] Date of Patent: Aug. 9, 1994

[54] DYNAMIC RANDOM ACCESS MEMORY DEVICE

[75] Inventor: Toru Ishikawa, Tokyo, Japan
[73] Assignee: NEC Corporation, Tokyo, Japan
[21] Appl. No.: 995,706
[22] Filed: Dec. 23, 1992
[30] Foreign Application Priority Data Dec. 27, 1991 [JP] Japan .................. 3-359811

[51] Int. Cl.⁵ .............................................. G11C 7/00
[52] U.S. Cl. ......................... 365/222; 365/230.03; 365/203
[58] Field of Search ............ 365/203, 230.03, 222, 365/233, 230.01, 189.12

[56] References Cited
U.S. PATENT DOCUMENTS

| | | | |
|---|---|---|---|
| 4,941,128 | 7/1990 | Wada | 365/203 |
| 5,148,400 | 9/1992 | Fujii | 365/222 |
| 5,184,324 | 2/1993 | Ohta | 365/203 |
| 5,226,139 | 7/1993 | Fujishima | 365/230.03 |

Primary Examiner—Eugene R. LaRoche
Assistant Examiner—A. Zarabian
Attorney, Agent, or Firm—Sughrue, Mion, Zinn, Macpeak & Seas

[57] ABSTRACT

A dynamic random access memory device has a memory cell array arranged in a matrix form, a pair of digit lines connected to each row and transferring data read out from a memory cell designated by a row address, an amplifier activated in response to an activation command for amplifying data on the pair of digit lines, a selector for transferring amplified data of the amplifier designated by a digit address to a data bus, and a controller for maintaining the active state of the amplifier means during an interval between transferring of the amplified data by the digit selector and subsequent designation of the row address.

8 Claims, 15 Drawing Sheets

DYNAMIC RANDOM ACCESS MEMORY DEVICE

BACKGROUND OF THE INVENTION

The present invention relates to a dynamic random access memory device (DRAM). More specifically the invention relates to a DRAM with increased process speed.

FIG. 13 is a block diagram of the conventional 4 Mbits DRAM formed with four 1 Mbits memory cell arrays. The 4 Mbits DRAM includes memory cell arrays 100, 110, 120 and 130 in a matrix form of 4000 bits×256 rows. Row decoders 102, 112, 122 and 132, sense amplifiers 103, 113, 123 and 133 for amplification and refreshing of read out data of the memory cells, and column decoders 104, 114, 124 and 134 are provided corresponding to respective of these memory cell arrays. Also, a block decoder 140 is provided for performing selection of respective of the memory cell arrays. The block decoder, the row decoder and the column decoder generate decoded outputs in response to 10 bits address signal AD0~AD9. Furthermore, a refresh, R/W controller 141 is provided for generating timing signals (RAS, CAS, WE, OE) necessary for respective of reading, writing and reflecting operations.

In this DRAM, the data bits held in each memory cell are regularly or periodically refreshed. Assuming that the memory cell arrays to be refreshed at one refreshing operation is 1 block, the 4 Mbits DRAM is refreshed per each memory cell arrays 100, 110, 120 and 130. Since each block is 4000 bits×256 rows, the refreshing operation will be completed by 1024 times of refreshing operation for a unit of 4 Kbits.

Constructions of the sense amplifier 103 and the column decoder 104 connected to a pair of digit lines D, and CD are shown in FIG. 14. Memory cells are connected to respective of junctions of word lines W0~W255 and the pair of digit lines D and CD. The pair of digit lines D and CD are enabled to be precharged by providing an equal potential by means of a precharge transistor 1 which is activated through a precharge line PRC.

The sense amplifier 103 is in a form of a differential amplifier with C-MOS transistors. The active state and inactive state of this sense amplifier is controlled by activation lines SAP and SAN. The sense amplifier is activated by supplying a power source level to the line SAP and a grounding level to the line SAN. On the other hand, the sense amplifier is deactivated by supplying an intermediate level for both lines. The column decoder 104 is designed to supply an amplified data of the sense amplifier 103 to a data bus I/O by supplying the power source level to a column selection line YSW.

FIG. 15 shows signal waveforms at major portions in the circuits of FIGS. 13 and 14. Before access, the pair of digit lines C and CD are held at the equal level by precharge of the transistor I due to high level at the precharge line PRC. After initiation of access (time $t_1$), the activation lines SAP and SAN respectively become the power source level and the ground level to activate the sense amplifier 103. Then, the word line W0 is selected and thus the power source level is supplied thereto. According to cell data on this word line W0, the pair of digit lines D and CD are driven. Subsequently, the column selection line YSW of the column decoder 104 becomes the power source level (time $t_2$). Then, the data on the pair of digit lines C and CD is transferred to a pair of data bus I/O. After completion of access, all of the activation lines SAP and SAN and the digit lines C and CD become equal level. Then, the sense amplifier 103 returns into the inactive state.

Substantially the same process of operations to the above-mentioned reading out operation takes place in a refreshing operation.

The conventional DRAM as set forth above includes high speed access modes, such as a page mode, static column mode or so forth. However, such high speed access is only effective for the data present in the activated sense amplifier upon activation of the sense amplifier even though the data in all of the memory cells connected to the word line are read out in response to rising of the potential at the word line. Once the access is completed, the data is not saved so that the next access has to be again initiated from selection of the word line. In addition, associated with increasing of the capacity of the DRAM, it is becoming impossible to activate overall sense amplifiers. In practice, in case of the DRAM of 4 Mbits, only one fourth of the sense amplifier can be activated at one time. Accordingly, data to be accessed in the high speed access mode, such as page mode, static column mode or so forth is limited to those held by the activated sense amplifiers which are one fourth of the overall sense amplifiers.

Discussing about the example of FIG. 13, when the sense amplifier 103 is activated, remaining sense amplifiers 113, 123 and 133 are held at inactive state and thus not maintaining data. Also, since the block address is input as a part of the row address signals, it is not possible to select the memory cell arrays 100~130 by the column decoder 104. Therefore, even when the sense amplifiers 103, 113, 123 and 133 hold data, high speed access cannot be performed.

As discussed above, in the prior art, capability of high speed access is limited to one of a plurality of memory cell arrays 100~130. Therefore, there is a limitation for high speed access to the data held in the DRAM.

SUMMARY OF THE INVENTION

Therefore, it is an object of the present invention to provide a DRAM which can expand an accessible range in a high speed access, such as a page mode or so forth.

Another object of the invention is to provide a DRAM which permit access of all data held in sense amplifiers.

In order to accomplish the above-mentioned and other objects, a dynamic random access memory device comprises memory cell array arranged in a matrix form, a pair of digit lines connected to each row and transferring data read out from a memory cell designated by a row address, amplifier means activated in response to an activation command for amplifying data on the pair of digit lines, digit selection means for transferring amplified data of the amplifier means designated by a digit address to a data bus, and control means for maintaining the active state of the amplifier means during an interval between transferring of the amplified data by the digit selection means and subsequent designation of the row address.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention but are for explanation and understanding only.

In the drawings.

DESCRIPTION OF THE PREFERRED EMBODIMENT

Figure 1:
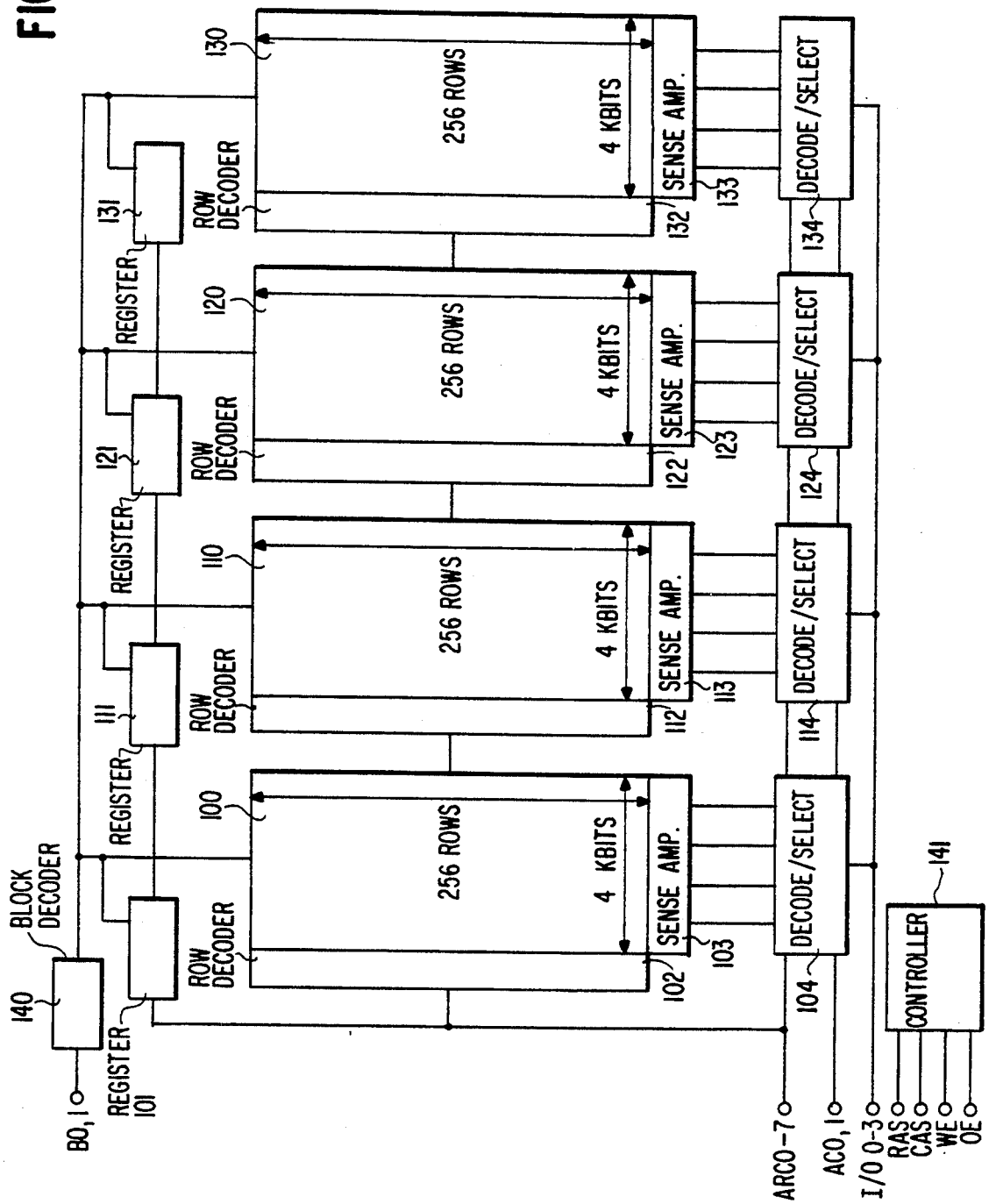
FIG. 1 is a block diagram of the first embodiment of a DRAM according to the present invention.

The preferred embodiments of the present invention will be discussed hereafter in detail with reference to the drawings. FIG. 1 shows a block diagram of the first embodiment of a dynamic random access memory (DRAM) device according to the present invention, in which is illustrated the DRAM including four 1 Mbit memory cells 100, 110, 120 and 130. Namely, the shown embodiment of the DRAM is provided with 4 Kbits×256 rows of memory cell arrays 100, 110, 120 and 130 are provided. For respective memory cell arrays, corresponding row decoders 102, 112, 122 and 132, sense amplifiers 103, 113, 123 and 133 for differential amplification of data read out from respective memory cells, column decoder/selectors 104, 114, 124 and 134, and registers 101, 111, 121 and 131 holding row addresses of data held in the sense amplifiers 103, 113, 123 and 133, are provided.

8 bits row column address signals ARC0~ARC7 and 2 bits column address signals AC0 and AC1 are input to the column decoder/selectors. On the other hand, the row column address signals are input to the registers 101, 111, 121 and 131. The DRAM is further provided with a refresh/R/W controller 141 for generating timing signals RAS, CAS, WE and OE for respective of reading out, writing in and refreshing operations. Furthermore, a block decoder 140 is provided for permitting selection of the memory cell arrays 100, 110, 120 and 130. For the block decoder 140, 2 bits block selection signal B0 and B1 are externally applied so as to enable access of all data held in the sensing amplifiers 103, 113, 123 and 133 even with the signal other than the address signals ARC0~ARC7 and AC0 and AC1.

Figure 2:
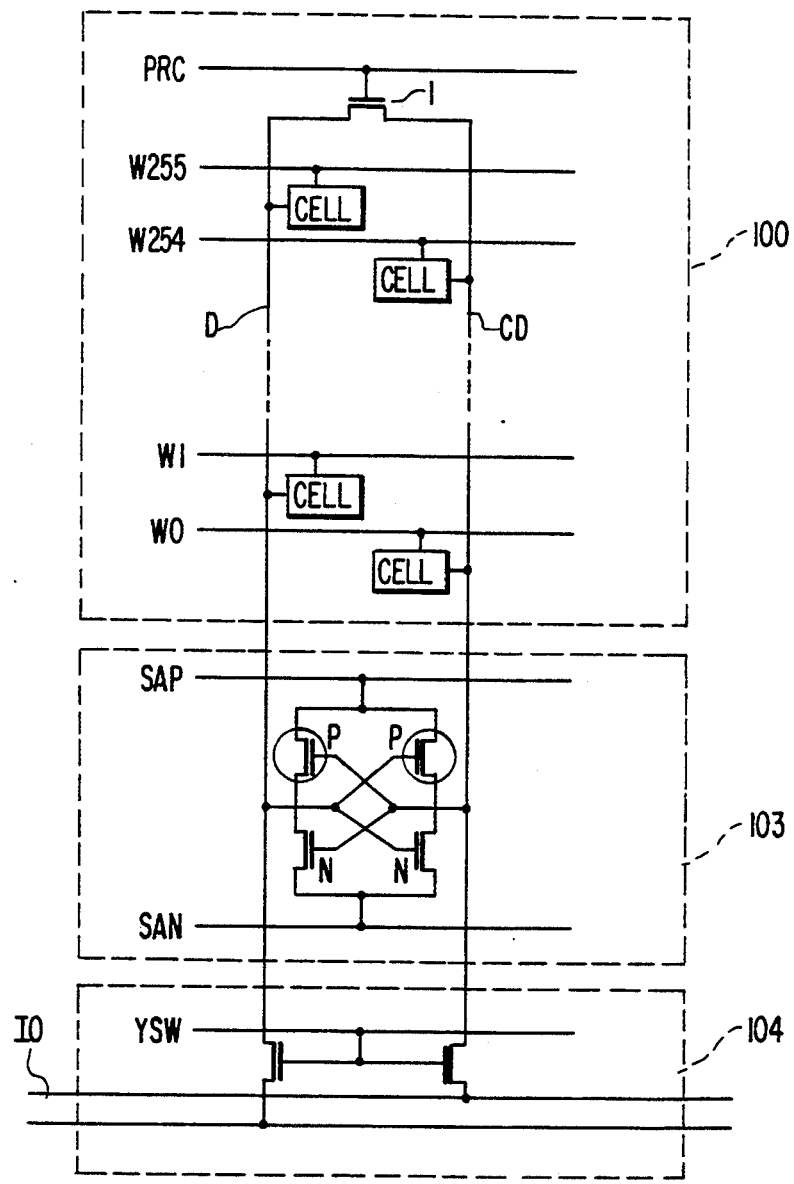
FIG. 2 is a partial circuit diagram of the first embodiment of the DRAM of the invention.
Figure 14:
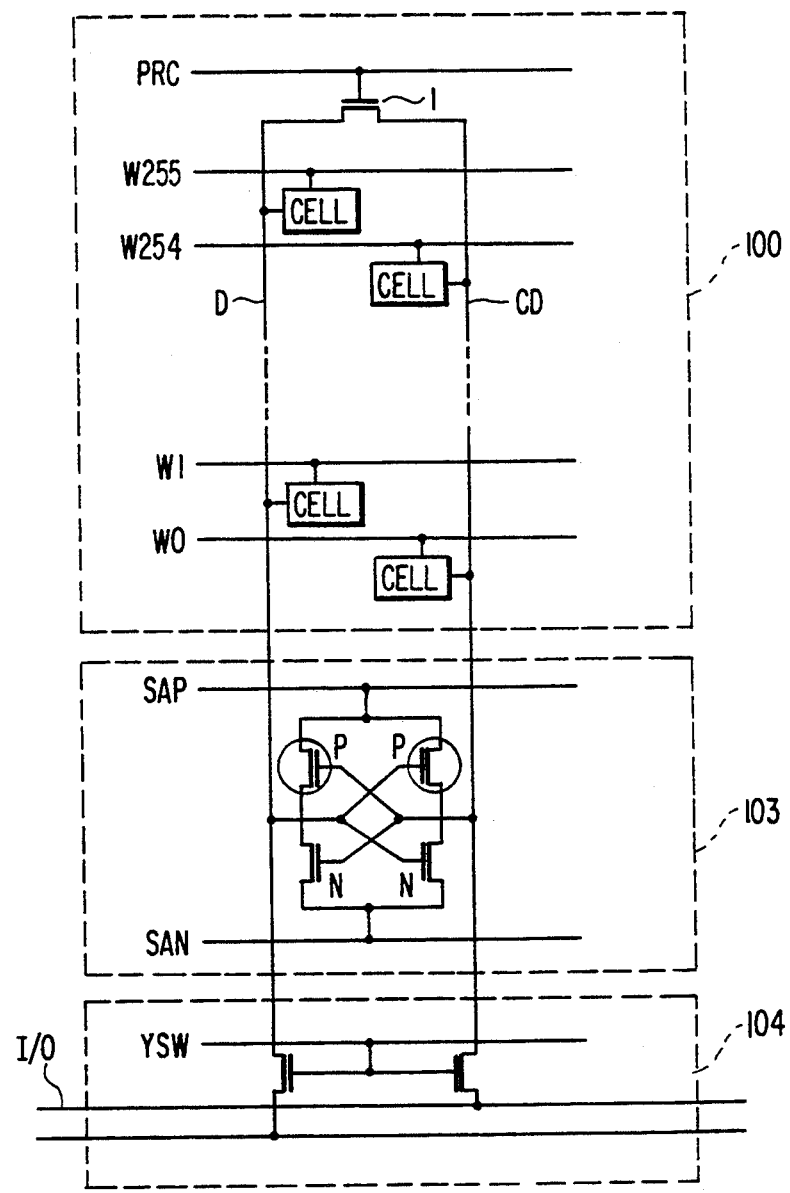
FIG. 14 is a partial circuit diagram of the conventional DRAM.
Figure 15:
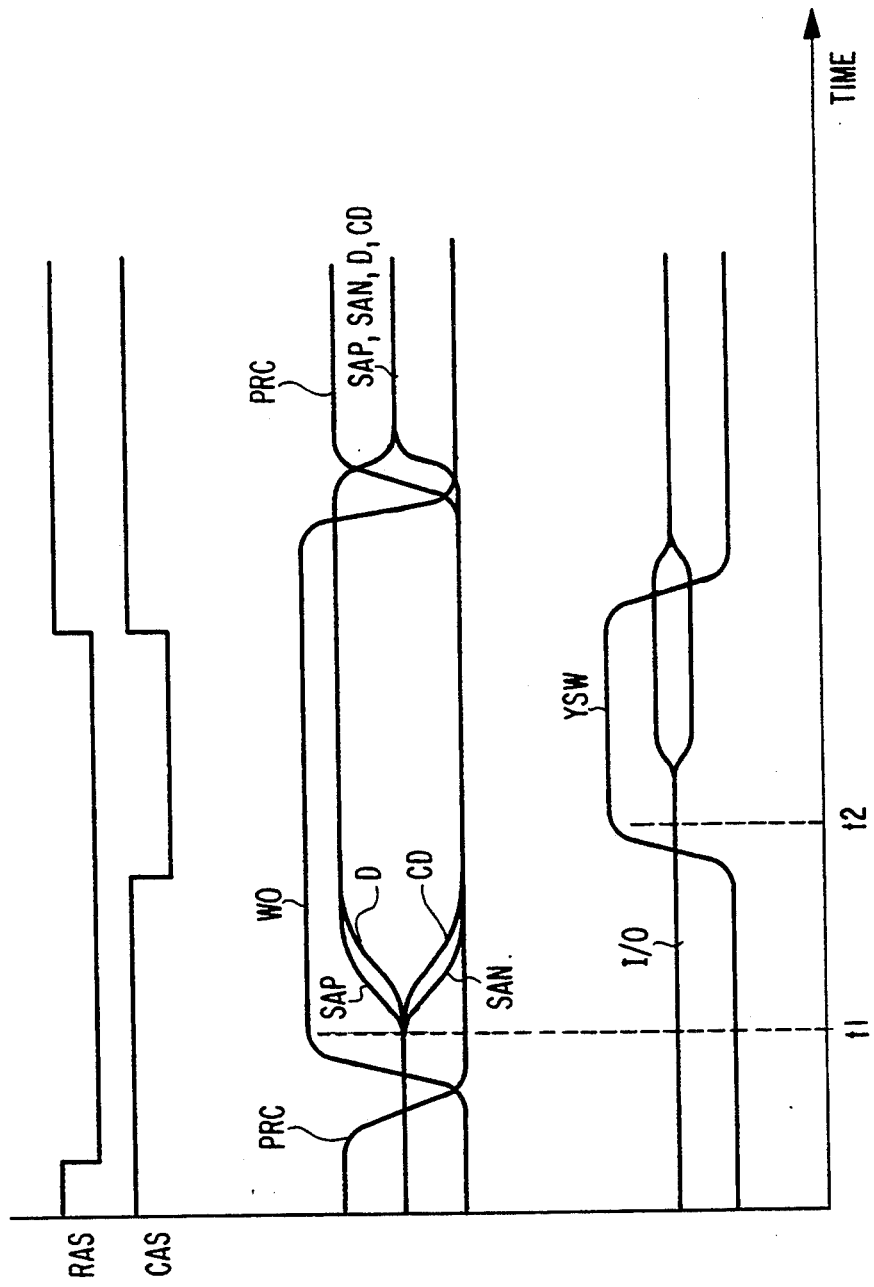
FIG. 15 is a timing chart showing signal waveforms of the circuit of the conventional DRAM.

FIG. 2 shows partial circuit constructions of the memory cell array 100, the sense amplifier 103, the column decoder/selector 104. Although the circuit constructions per se are the same to those of the prior art illustrated in FIG. 14, respective signal waveforms are differentiated therefrom. The waveforms are shown in FIG. 3.

Figure 3:
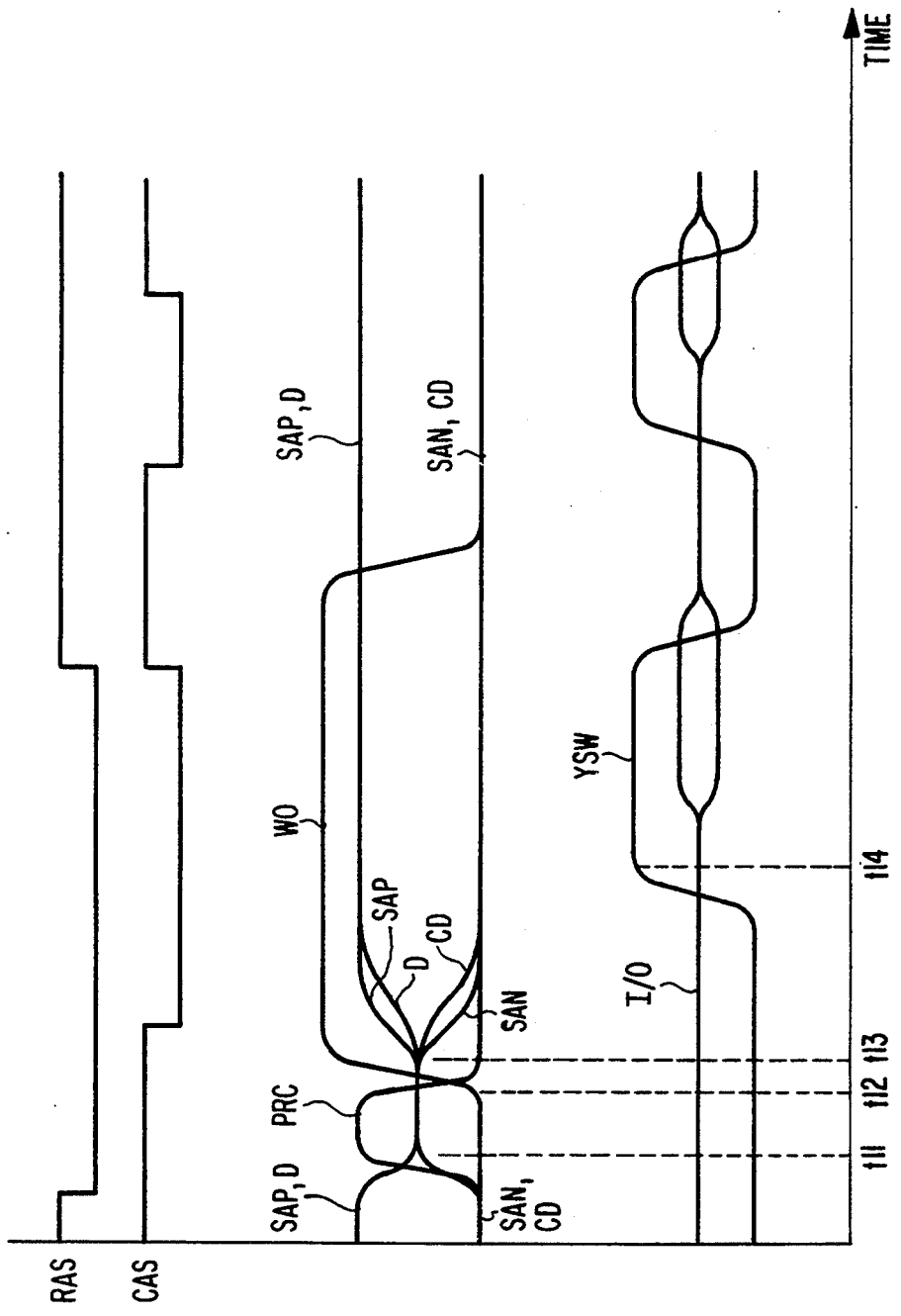
FIG. 3 is a timing chart showing signal waveforms in the circuit of the first embodiment of the DRAM of the invention.

As shown in FIG. 3, the sense amplifier activation lines SAP and SAN and the digit line pair D and CD are held at active state even before initiation of access. On the sense amplifiers 103, 113, 123 and 133, data on word lines accessed with respect to respective of the memory cells in the immediately preceding access operation are held. When accessing is initiated, the level of the precharge line PRC turns into HIGH level to precharge the digit lines D and CD (time $t_{11}$). Subsequently, at rising of the level of the word line W0 (time $t_{12}$), the sense amplifier 103 is activated (time $t_{13}$), the data on the word line W0 appears on the digit lines D and CD. When the level of the column selection line YSW becomes the power source level (time $t_{14}$), the data on the digit lines D and CD appears on the data bus I/O. Even after termination of access, the sense amplifier activation lines SAP and SAN and the digit lines D and CD are held in the active state to hold the data. Therefore, upon occurrence of column access, the data of other digit line can be fed to the data bus I/O only by turning another column selection signal YSW into the power source level so that the sense amplifier 103 may protect the data.

On the other hand, by externally providing block addresses B0 and B1, the block decoder 140 may be enabled to select the memory array. Therefore, it becomes possible to perform high speed access for all data held on the sense amplifiers 103, 113, 123 and 133.

Figure 4:
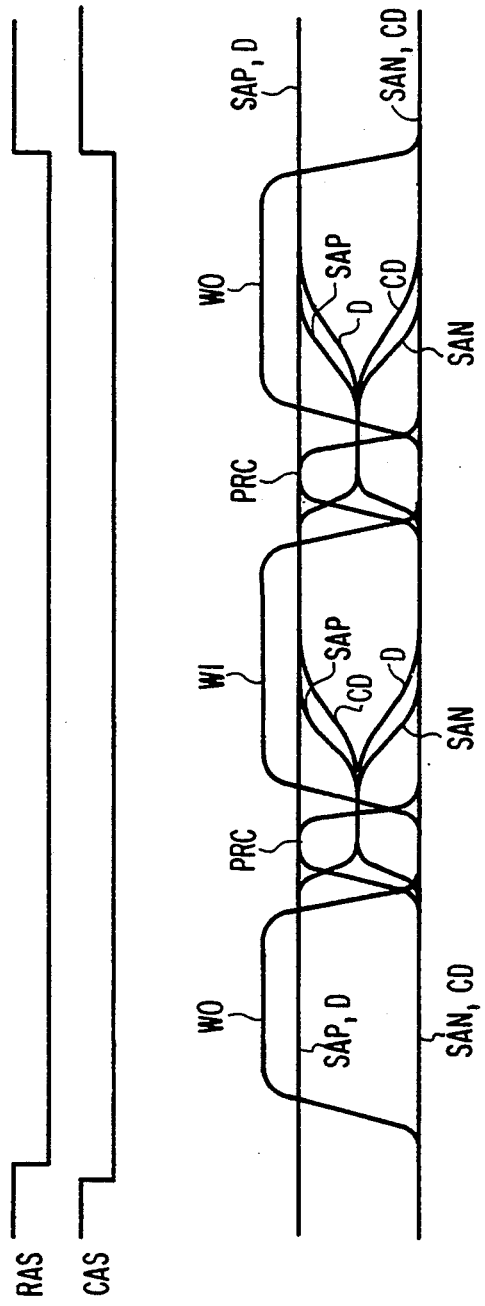
FIG. 4 is a timing chart showing signal waveforms during refreshing operation of the circuit of the first embodiment of the DRAM of the invention.

As shown in FIG. 4, upon refreshing, data on the digit line pair D and CD are written in as data on the word line W0 designated by the row address held in the register 101, 111, 121 and 131. Thereafter, the data on the word line W1 to be refreshed is subsequently refreshed. Then, finally, the data on the word line W0 designated by the row address held by the registers 101, 111, 121 and 131 are read out to recover the data on the digit line pair D and CD with the data on the word line W0 to resume the condition before refreshing. Incidentally, while the memory cell array 100 is in the refreshing state, the data are held in the sense amplifier 113, 123 and 133 and hence it is possible to access these data.

Figure 5:
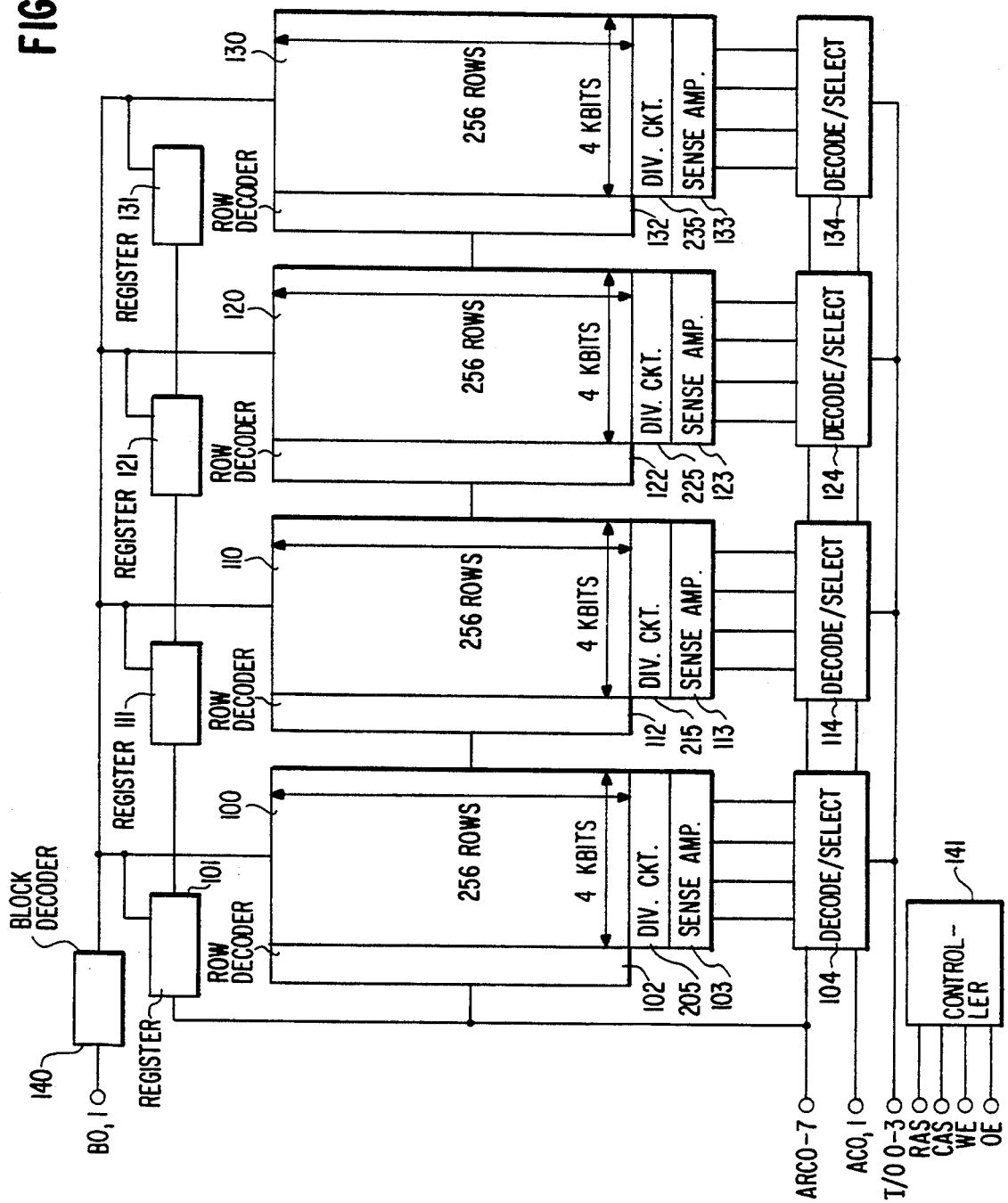
FIG. 5 is a block diagram of the second embodiment of a DRAM according to the present invention.
Figure 6:
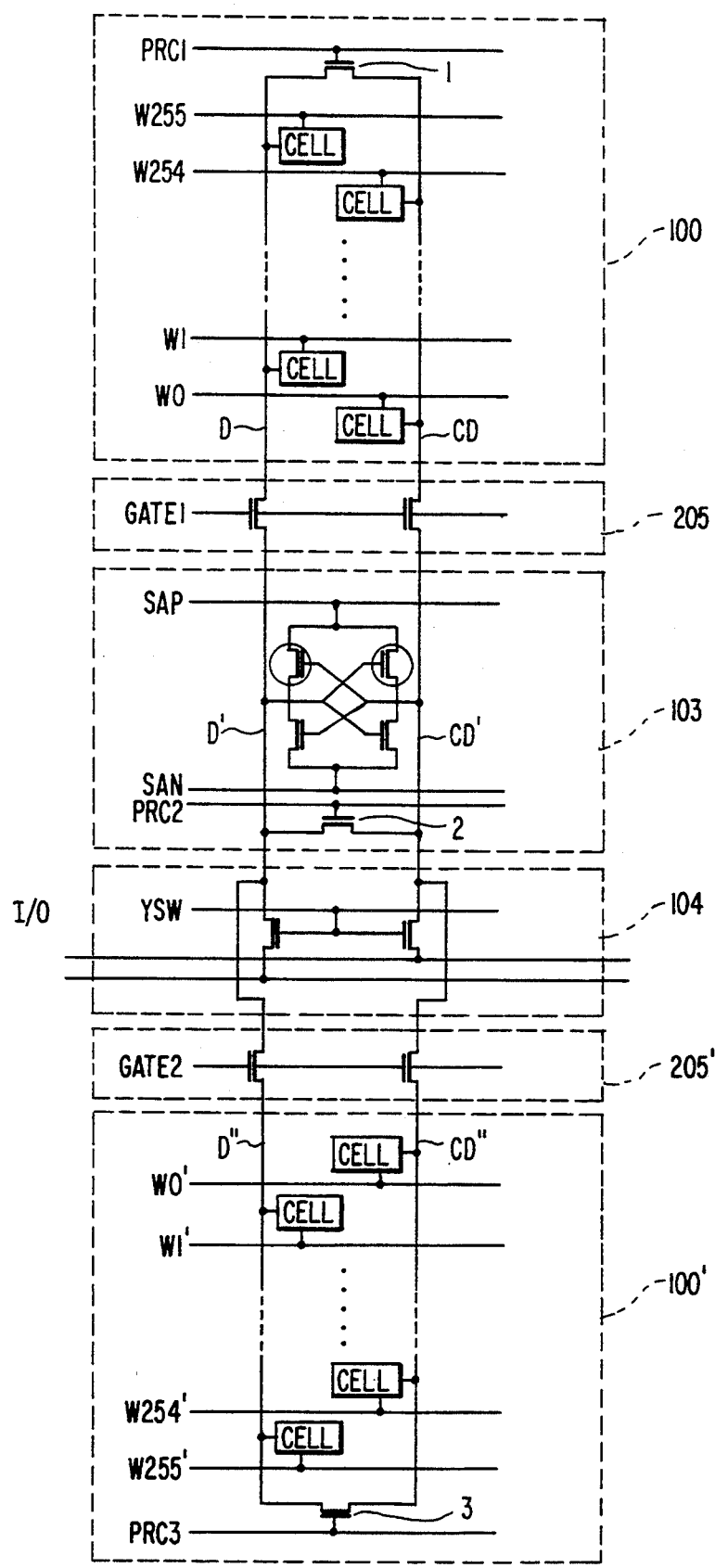
FIG. 6 is a partial circuit diagram of the second embodiment of the DRAM of the invention.

FIG. 5 shows the second embodiment of DRAM according to the present invention, and FIG. 6 shows a partial concrete circuit diagram thereof. The shown embodiment is called division type sensing system, in which respective sense amplifiers 103, 113, 123 and 133 performs differential amplification for respective data on a plurality of pairs (two pairs in the shown embodiment) of digit lines D, CD and D'', CD''. In the shown division type sensing system, the data on respective of the digit lines are mutually differentiated from each other. Therefore, it is not possible to maintain the data on respective digit line pairs by one sense amplifier. Therefore, in the shown embodiment, division circuits 205, 215, 225 and 235 are interposed between the memory cell arrays 100, 110, 120 and 130 and the sense amplifiers 103, 113, 123 and 133.

Namely, a pair of digit lines are divided into three zones, i.e. D, CD; D', CD'; and D", CD". The first zone of the digit lines D and CD and the third zones of the digit lines D" and CD" are both connected to the memory cells, and the second zone of the digit lines D' and CD' are connected to the sense amplifier 103. Between the first and second zones, a first division circuit 205 is provided. Also, the second division circuit 205' is provided between the second and third zones. These first and second division circuits 205 and 205' performs establishing and blocking connection between respective zones by control lines GATE1 and GATE2.

Precharge circuits 1~3 are provided for precharging respective of the zones of the digit line pairs so that the precharging can be controlled by precharge lines PRC1, PRC2 and PRC3.

Figure 7:
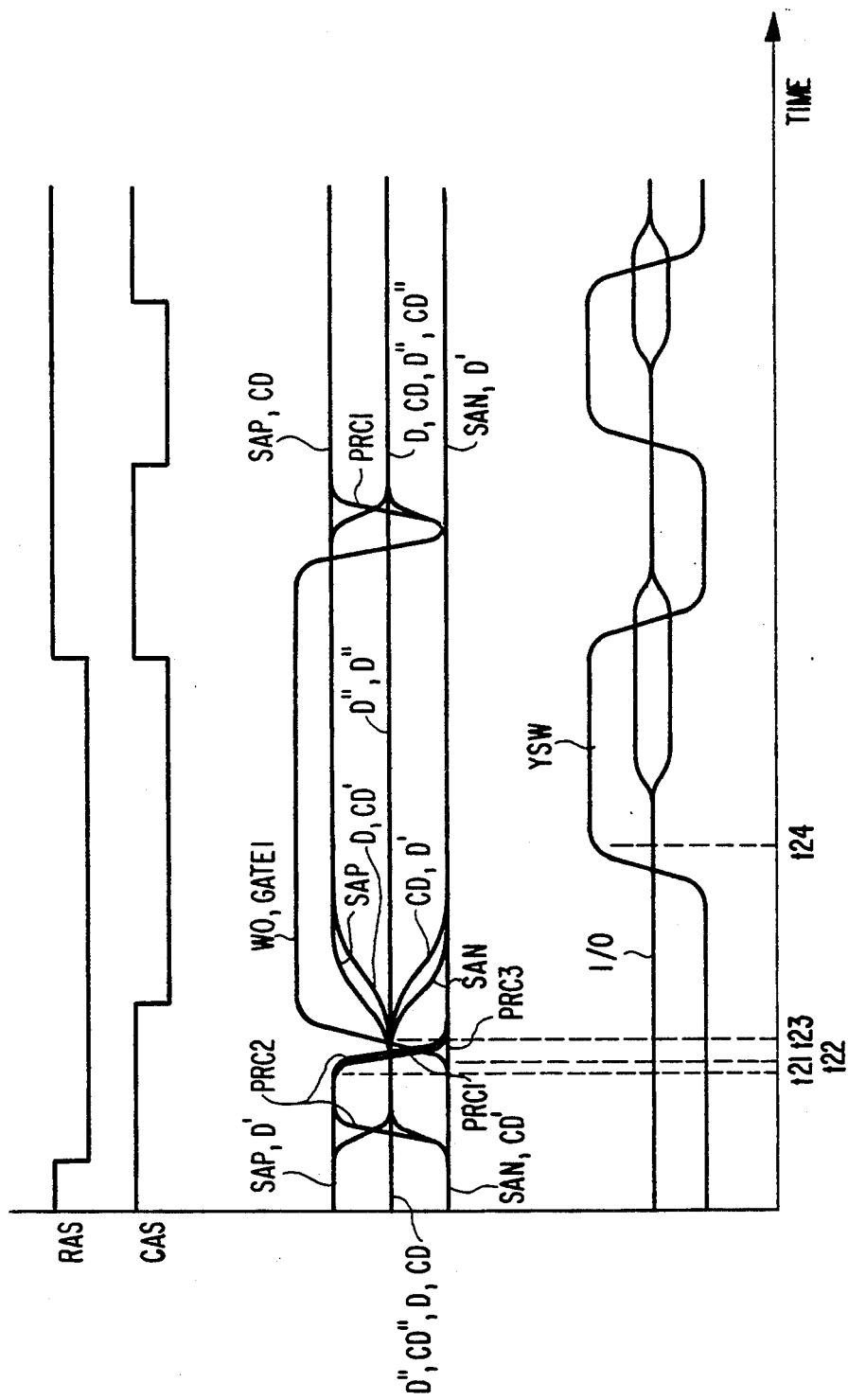
FIG. 7 is a timing chart showing signal waveforms in the circuit of the second embodiment of the DRAM of the invention.

FIG. 7 shows signal waveforms illustrating operation of the second embodiment of the DRAM as set forth above. As shown in FIG. 7, the sense amplifier activation lines SAP and SAN and the digit lines D' and CD' are held active even before initiation of access operation. Data on the word lines accessed in the preceding access operation with respect to each memory cell arrays 100~130 are held in the sense amplifiers 103, 113, 123 and 133. It should be noted that, the control lines GATE1 and GATE2 are held LOW level, the precharge lines PRC1 and PRC3 are held HIGH level, and the digit line pairs D, CD and D", CD" are precharged at the equal levels. Then, upon initiation of access operation, the digit line pair D' and CD' is precharged by the precharge line PRC2 (time $t_{21}$). Subsequently, the levels of the word line W0 and the control line GATE1 rise to activate the sense amplifier 103 (time $t_{23}$). Then, the data on the word line W0 appears on the digit line pair D" and CD'. When the level of the column selection line YSW turns into the power source level (time $t_{24}$), the data on the digit lines D' and CD' appear on the data bus I/O. At this time, the digit line pair D" and CD" are held at the precharged condition.

After termination of access, the levels of the word line W0 and the control line GATE1 fall down. Then, the digit line pair D and CD are precharged to become mutually the equal levels. However, at this time, the sense amplifier activation lines SPA and SAN and the digit lines D' and CD' are held at the active state to maintain the data. Accordingly, upon occurrence of the column access, the sense amplifier 103 holds the data, the data on the digit lines D' and CD' appear on the data bus I/O only by turning the level of the column selection line YSW.

Figure 8:
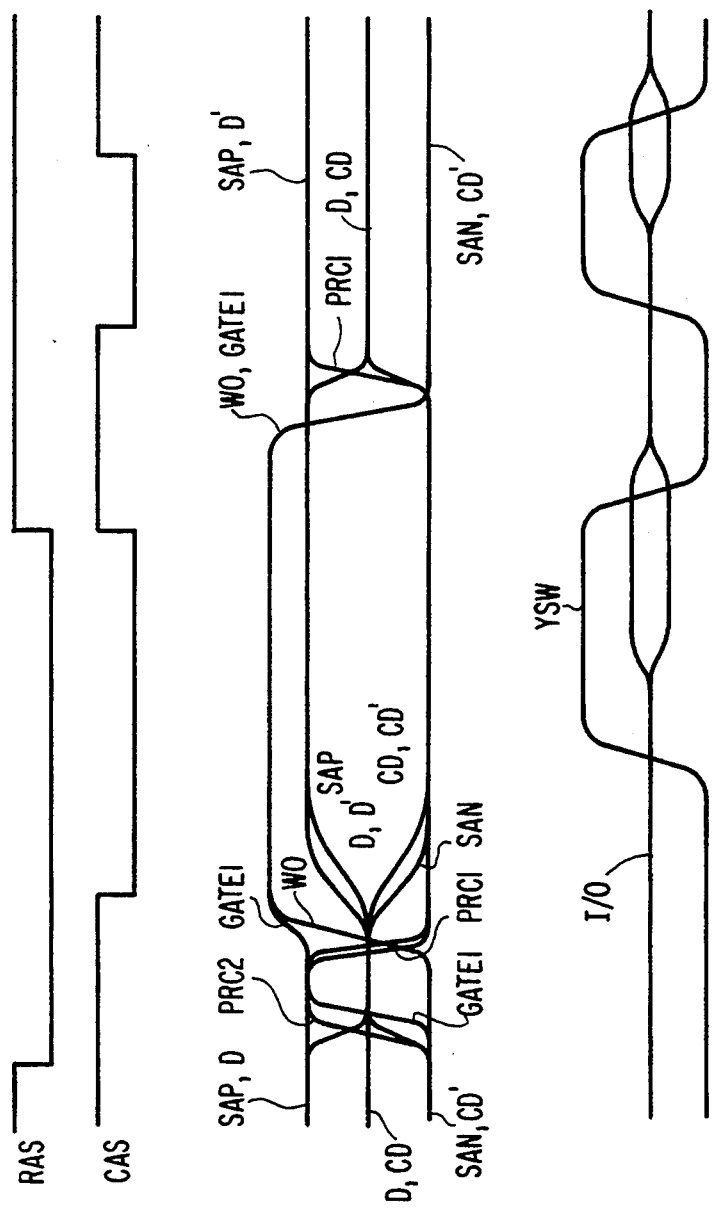
FIG. 8 is a timing chart showing another example of the signal waveforms of the circuit of the second embodiment of the DRAM of the invention.

FIG. 8 shows operational waveforms in an alternative embodiment of the second embodiment set forth above. The control signal GATE1 becomes HIGH level upon initiation of precharging in response to turning of the precharge signal PRO2 into HIGH level. Then, the precharge levels of the digit line pair D' and CD' and the digit line pair D and CD become equal to each other.

Figure 9:
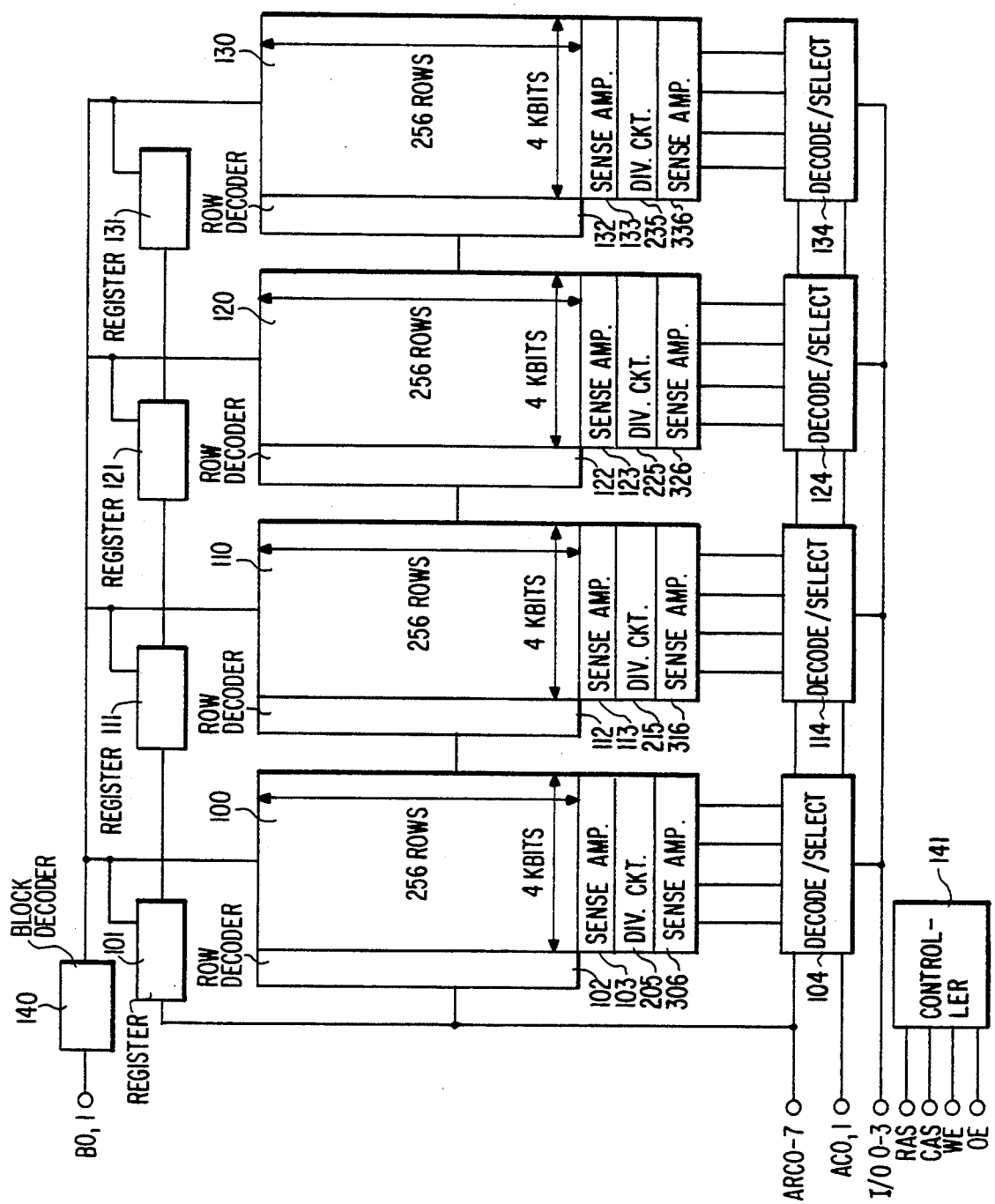
FIG. 9 is a block diagram of the third embodiment of a DRAM according to the present invention.
Figure 10:
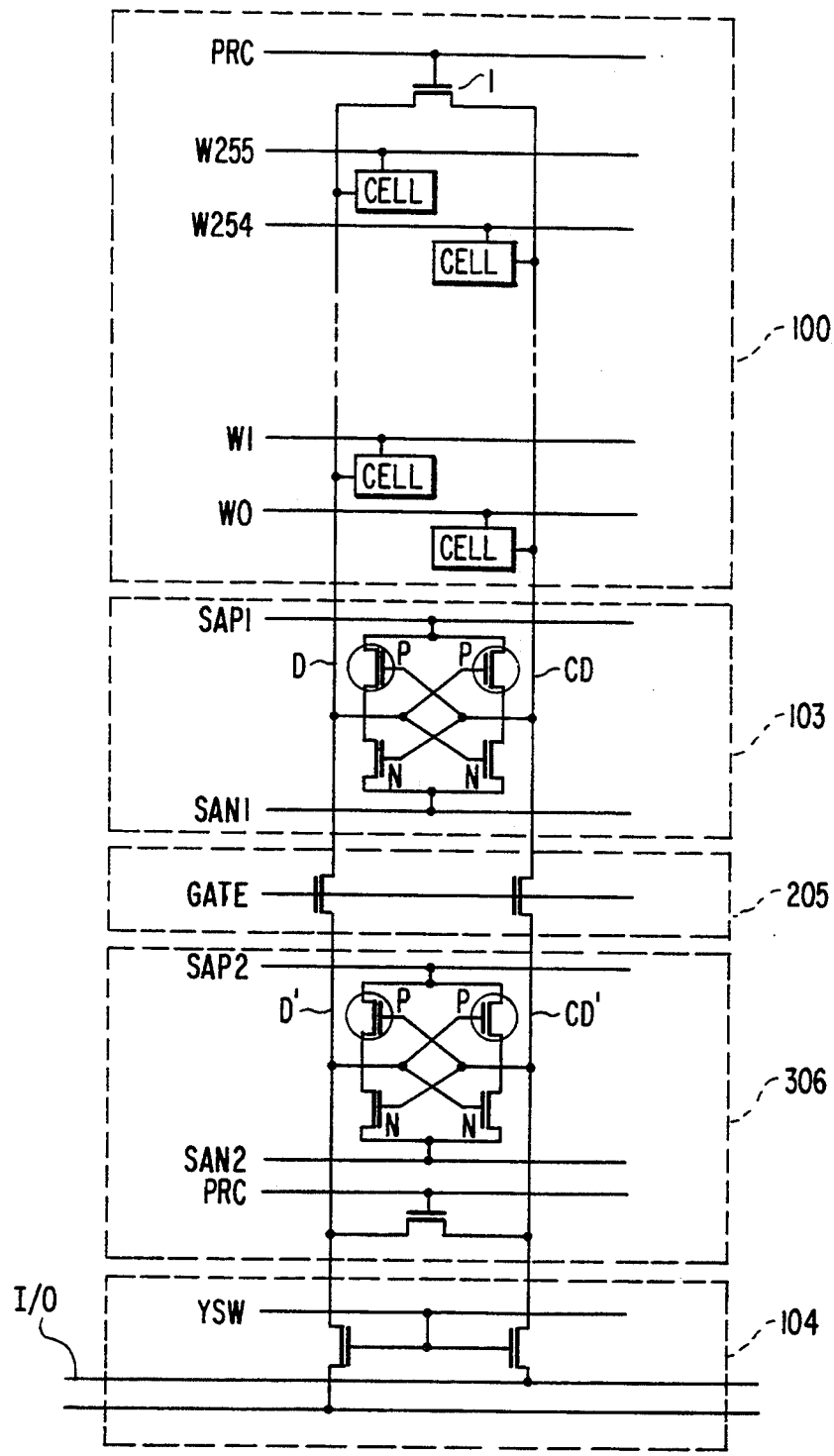
FIG. 10 is a partial circuit diagram of the third embodiment of the DRAM of the invention.

FIG. 9 is a block diagram showing the third embodiment of the DRAM according to the invention. In the foregoing first and second embodiments, the control as illustrated in FIG. 4 was required in order to perform refreshing without erasing data held in the sense amplifiers. This is because that the data holding and refreshing cannot be performed simultaneously as a pair of digit lines or connectable digit line group are connected to one sense amplifier. Therefore, as shown in FIG. 10, in the third embodiment, two sense amplifiers 103 and 306 are provided for connectable digit line group. The sense amplifiers 103, 113, 123 and 133 between the division circuits 205, 215, 225 and 235 and the memory cell arrays 100, 110, 120 and 130 are used for refreshing.

Figure 11:
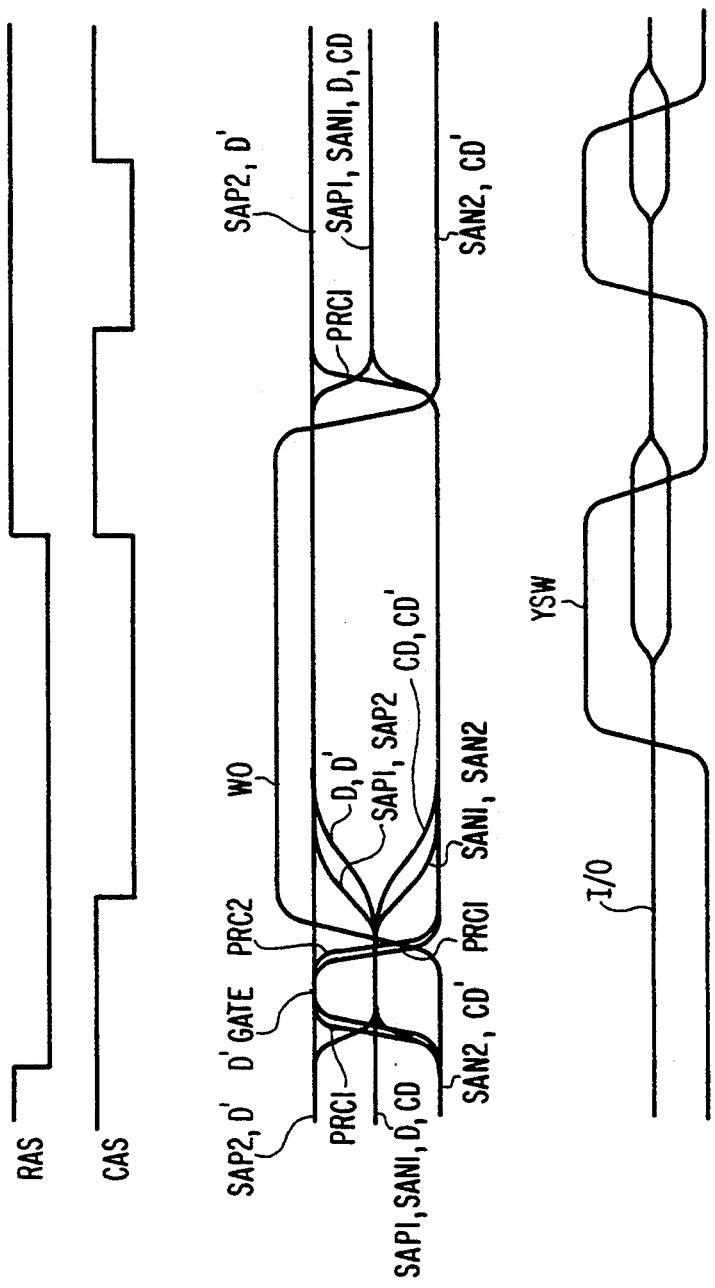
FIG. 11 is a timing chart showing signal waveforms in the circuit of the third embodiment of the DRAM of the invention.

FIG. 11 shows signal waveforms illustrating the operation of the shown embodiment. The method for controlling respective signals is substantially the same as that of the second embodiment. However, in the shown embodiment, it becomes unnecessary to rise the level of the control signal GATE (division and connection control signal of the division circuit 205) to the power source. In this embodiment, the level equal to the HIGH level of other activation lines SAP and SAN is sufficient. This is because that one of the digit line pair D' and CD' is activated up to the power source level and the other activated up to the ground level, by the sense amplifiers 306, 316, 326 and 336.

Figure 12:
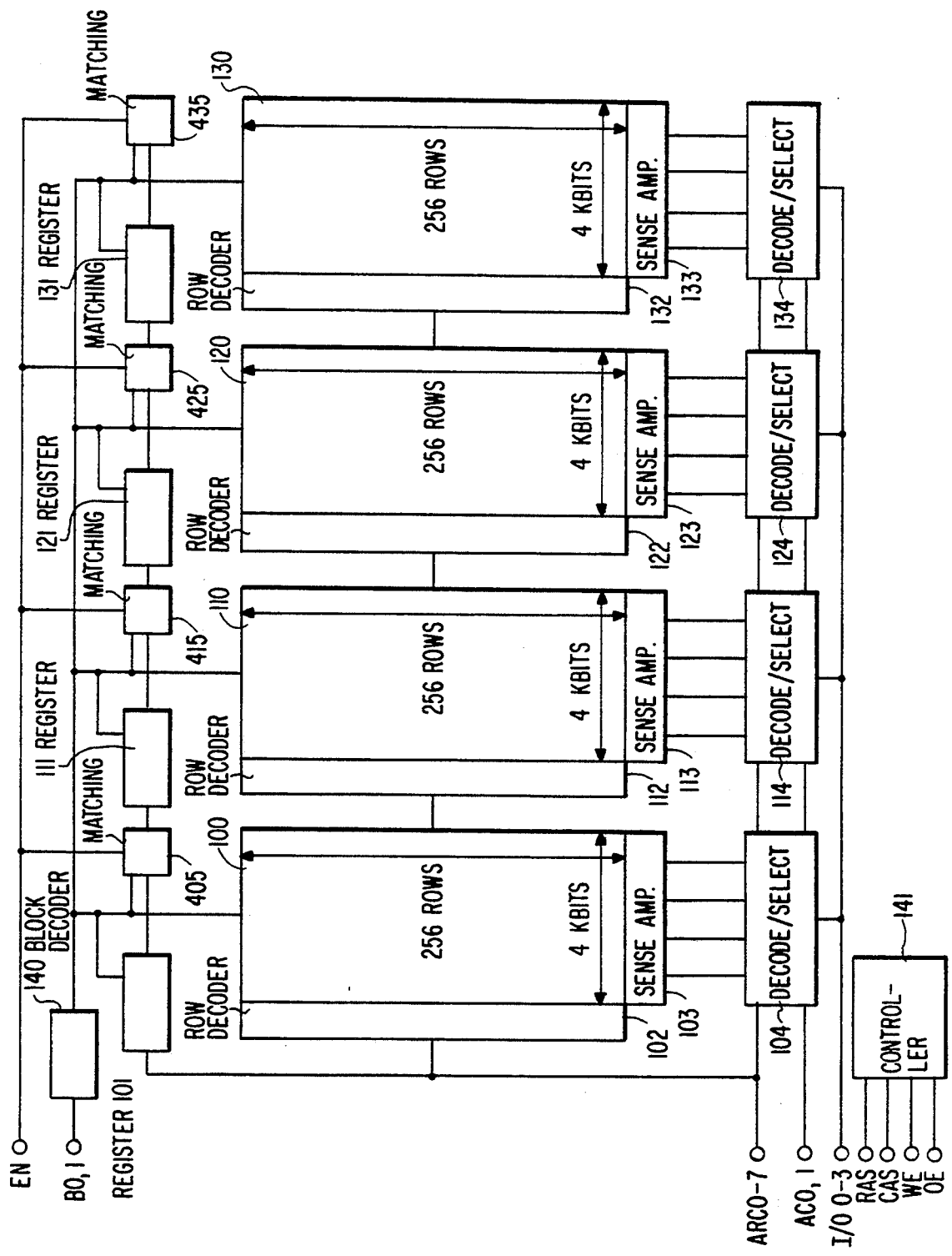
FIG. 12 is a block diagram of the fourth embodiment of a DRAM according to the present invention.
Figure 13:
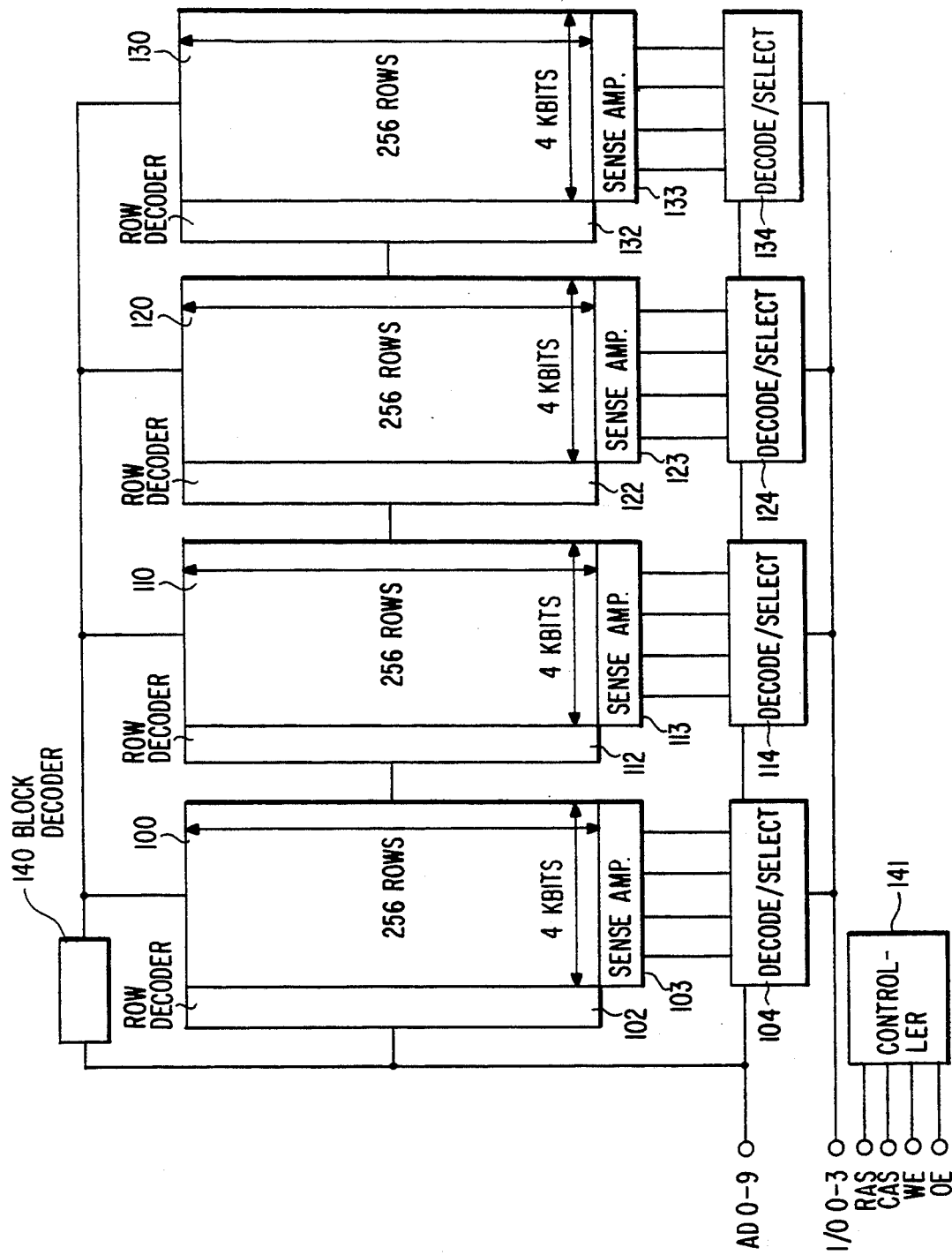
FIG. 13 is a block diagram of the conventional DRAM.

FIG. 12 is a block diagram showing the fourth embodiment of the present invention. In the first and second embodiments, when one memory array is being refreshed, the data on the sense amplifier corresponding to the memory array being refreshed cannot be accessed. Furthermore, in case of the system where the address to be refreshed is set by an internal counter, it is not possible to externally know that the sense amplifier corresponding to the memory cell being refreshed and the externally accessed sense amplifier are matched with each other.

Therefore, in the fourth embodiment, matching detection circuits 405, 415, 425 and 435 are provided for detecting matching of the sense amplifier corresponding to the memory cell being refreshed and the externally accessed sense amplifier. During refreshing operation, refresh address derived by the block decoder 140 on the basis of the block address B0 and B1 is compared with a part of the externally accessed address ARC0~ARC7 by the matching detection circuits 405, 415, 425 and 435. The matching detection circuits 405, 415, 425 and 435 generate a matching signal EN when matching is detected.

As set forth above, according to the present invention, since the data are maintained in the sense amplifier even after access. Therefore, at the subsequent occurrence of access, the initial processes, such as precharging of the digit lines or activation of sense amplifier and so forth, are not required to permit high speed access. Also, since respective memory cell can be externally selected by the block address, high speed access for all of data held on the sense amplifier becomes possible. Therefore, in comparison with the conventional DRAM, the accessible data range in the high speed access can be significantly expanded.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A dynamic random access memory device comprising:
   a memory cell array arranged in a matrix form,
   a pair of digit lines connected to each row and transferring data read out from a memory cell designated by a row address,
   amplifier means activated in response to an activation command for amplifying data on said pair of digit lines,
   digit selection means for transferring amplified data of said amplifier means designated by a digit address to a data bus,
   control means for maintaining an active state of said amplifier means during an interval between transferring of the amplified data by said digit selection means and subsequent designation of the row address.
   a register provided corresponding to each memory cell array for storing row address upon initiation of refreshing, and
   means for effecting the data of the memory cell designated by said row address stored in said register to be input to said amplifier means after refreshing.

2. A dynamic random access memory device as set forth claim 1, which further comprises:
   precharging means for precharging said pair of digit lines; and
   means for controlling said precharging means corresponding to said subsequently designated row address for precharging the corresponding pair of digit lines.

3. A dynamic random access memory device as set forth in claim 1, which further comprises means for varying a column address for reading out data from said amplifier means maintained in the active state to said data bus in advance of subsequent designation of said row address.

4. A dynamic random access memory device as set forth in claim 1, further comprising at least one additional memory cell array and block decoder means for enabling a selective access of said memory cell array and said additional memory cell array.

5. A dynamic random access memory device as set forth in claim 4, wherein said block decoder means is adapted to permit selection of said memory cell array and said additional memory cell array by an externally entered block address.

6. A dynamic random access memory device as set forth in claim 1, wherein said pair of digit lines are respectively divided into a first zone, to which said memory cell is connected, a second zone, to which said amplifier is connected, and a third zone connected to remaining memory cells, a first dividing means is disposed between said first and second zones, a second dividing means is disposed between said second and third zones so that said first and third zones are precharged during an interval from transferring of the data from said amplifier means to said data bus to subsequent designation of a subsequent row address, and said second zone is precharged after designation of said subsequent row address.

7. A memory device comprising:
   a memory cell array including a plurality of word lines, a plurality of pairs of digit lines and a plurality of memory cells each connected to one of said word lines and one of said digit lines,
   a plurality of sense amplifiers,
   cooling means for coupling each of said pairs of digit lines to an associated one of said sense amplifiers,
   decoder means responsive to change of a row address strobe signal from an inactive level to an active level for selecting one of said word lines to cause a potential difference responsive to data stored in each of the memory cells connected to a selected one of said word lines to appear between an associated one of said pairs of digit lines,
   means for activating each of said sense amplifiers to cause each of said sense amplifiers to amplify the potential difference appearing between the associated one of said pairs of digit lines and to hold an amplified potential difference and for maintaining an activation of each of said sense amplifiers irrespective of change of said row address signal from said active level to said inactive level, the activation of each of said sense amplifiers continuing until said row address strobe signal changes again from said inactive level to said active level.

8. A memory device comprising:
   at least first and second memory cell array blocks each including a plurality of word lines,
   a plurality of pairs of digit lines and a plurality of memory cells each connected to one of said word lines and one of said digit lines,
   first and second sense amplifier blocks provided correspondingly to said first and second memory cell array blocks, said first sense amplifier block including a plurality of first sense amplifiers, said second sense amplifier block including a plurality of second sense amplifiers,
   first coupling means for coupling each of said pairs of digit lines of said first memory cell array block to an associated one of said first sense amplifiers,
   second coupling means for coupling each of said pairs of digit lines of said second memory cell array block to an associated one of said second sense amplifiers,
   first decoder means responsive to block selection information for selecting one of said first and second memory cell array blocks,
   second decoder means responsive to address information for selecting one of said word lines of said one of said first and second memory cell array blocks to cause a potential difference responsive to data stored in each of the memory cells to appear between an associated one of said pairs of digit lines, and
   activation means for activating one of said first and second memory cell array blocks to cause each of the sense amplifiers of said one of said first and second sense amplifier blocks to amplify the potential difference appearing between the associated one of said pairs of digit lines of said selected one of said first and second memory cell array blocks and to hold an amplified potential difference, said first decoder means selecting the other of said first and second memory cell array blocks in response to change of said block selection information, and said activation means maintaining an activation of said one of said first and second sense amplifier blocks corresponding to said one of said first and second sense amplifier blocks to hold the amplified potential difference during selection of said other of said first and second memory cell array blocks responsive to said change of said block selection information.

* * * * *

UNITED STATES PATENT AND TRADEMARK OFFICE
CERTIFICATE OF CORRECTION

PATENT NO. : 5,337,283
DATED : August 9, 1994
INVENTOR(S) : Ishikawa

It is certified that error appears in the above-indentified patent and that said Letters Patent is hereby corrected as shown below:

Column 5, line 57, change "PRO2" to --PRC2--.

Column 6, line 18, after "other" insert --is--;

Column 8, line 1, change "cooling" to --coupling--.

Signed and Sealed this

Twenty-fifth Day of April, 1995

Attest:

BRUCE LEHMAN

Attesting Officer

Commissioner of Patents and Trademarks